United States Patent
Xie et al.

(10) Patent No.: US 10,165,695 B2
(45) Date of Patent: Dec. 25, 2018

(54) APPARATUS FOR INSTALLING HIGH AND LOW VOLTAGE CONVERSION CIRCUIT, HIGH AND LOW VOLTAGE CONVERSION SYSTEM AND POWER SOURCE

(71) Applicant: Delta Electronics (Shanghai) Co., Ltd., Shanghai (CN)

(72) Inventors: Yicong Xie, Shanghai (CN); Weiqiang Zhang, Shanghai (CN); Baoyu Liu, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 2 days.

(21) Appl. No.: 15/715,140

(22) Filed: Sep. 25, 2017

(65) Prior Publication Data
US 2018/0153046 A1    May 31, 2018

(30) Foreign Application Priority Data
Nov. 29, 2016 (CN) .......................... 2016 1 1076514

(51) Int. Cl.
| H05K 5/02 | (2006.01) |
| H05K 5/04 | (2006.01) |
| H05K 9/00 | (2006.01) |
| H05K 7/14 | (2006.01) |

(52) U.S. Cl.
CPC ............ *H05K 5/0217* (2013.01); *H05K 5/04* (2013.01); *H05K 7/1432* (2013.01); *H05K 9/0007* (2013.01)

(58) Field of Classification Search
CPC ....... H05K 5/0217; H05K 5/04; H05K 9/0007
See application file for complete search history.

(56) References Cited

U.S. PATENT DOCUMENTS

| 6,683,245 B1 * | 1/2004 | Ogawa ................. H05K 9/0037 174/382 |
| 9,906,158 B2 * | 2/2018 | Fukumasu ............ H02M 7/003 |
| 2002/0047616 A1 * | 4/2002 | Yamaguchi ............. H01F 27/02 315/276 |
| 2007/0070606 A1 * | 3/2007 | Guo .................... H05K 7/20509 361/714 |
| 2012/0238124 A1 * | 9/2012 | Zhao .................... H01R 13/707 439/350 |
| 2014/0078698 A1 * | 3/2014 | Yui ...................... H05K 9/0022 361/757 |

(Continued)

*Primary Examiner* — Hoa C Nguyen
*Assistant Examiner* — Christopher L Augustin
(74) *Attorney, Agent, or Firm* — CKC & Partners Co., Ltd.

(57) ABSTRACT

An apparatus for installing a high and low voltage conversion circuit, a high and low voltage conversion system and a power source are described. The apparatus includes: a first housing made of an insulation material and a second housing made of a metallic material, each being provided with two openings at both ends respectively in same direction; first and second housings are fixed, and are in contact on at least part of surfaces thereof; a first cavity and a second cavity are formed in first and second housings for installing a high-voltage circuit and a low-voltage circuit respectively, a high voltage terminal connected with high-voltage circuit and a low voltage terminal connected with low-voltage circuit are inserted through one opening of first housing and one opening of second housing respectively.

20 Claims, 5 Drawing Sheets

(56) References Cited

U.S. PATENT DOCUMENTS

2015/0357923 A1\* 12/2015 Nakazawa ........ H02M 3/33576
                                                  363/17
2017/0127540 A1\* 5/2017 You ..................... H05K 5/0026
2018/0019663 A1\* 1/2018 Fukumasu .............. H02M 1/44
2018/0270967 A1\* 9/2018 Honma ................... A45C 5/00

\* cited by examiner

APPARATUS FOR INSTALLING HIGH AND LOW VOLTAGE CONVERSION CIRCUIT, HIGH AND LOW VOLTAGE CONVERSION SYSTEM AND POWER SOURCE

CROSS REFERENCE TO RELEVANT APPLICATIONS

The present application claims the priority of the Chinese patent application No. 201611076514.0, entitled "APPARATUS FOR INSTALLING HIGH AND LOW VOLTAGE CONVERSION CIRCUIT, HIGH AND LOW VOLTAGE CONVERSION SYSTEM AND POWER SOURCE", filed on Nov. 29, 2016, the content of which is hereby incorporated by reference in its entirety.

TECHNICAL FIELD

The present application relates to an apparatus for installing a high and low voltage conversion circuit, a high and low voltage conversion system and a power source, belonging to the field of power equipment technologies.

BACKGROUND

In power equipment, a power electronic conversion apparatus is often employed to convert power from alternating current into direct current, or from direct current into direct current, or from direct current into alternating current, or from alternating current of the same frequency into alternating current, or from alternating current of variable frequency into alternating current. For example, in the branch power transmission lines (within a range of 2.4 kV-69 kV medium voltage) of the power system, the aforementioned power electronic conversion apparatus is used to realize the output of the power.

Multiple high and low voltage conversion systems of high frequency isolation transformation are generally cascaded on the existing medium-voltage branch power transmission lines, and the high and low voltage conversion systems include a high and low voltage conversion circuit and an apparatus for installing the aforementioned high and low voltage conversion circuit. The apparatus includes a closed housing; a low-voltage circuit and a high-voltage circuit of the high and low voltage conversion circuit are respectively installed at the front and rear end of the housing and are separated by an insulating barrier; an insulation layer is clad on the inner wall of the housing at one end of the high-voltage circuit, and terminals for cascading the high and low voltage conversion systems are introduced out of a left side wall and a right side wall.

However, the existing high and low voltage conversion system of this kind is additionally provided with a water-cooling device for cooling the high and low voltage conversion system.

SUMMARY

The present application provides an apparatus for installing a high and low voltage conversion circuit, a high and low voltage conversion system and a power source, so as to address the problem in the prior art that, a water-cooling device is required to be additionally arranged for cooling down the high and low voltage conversion system.

In order to solve the aforementioned problem, the following technical solutions are provided.

According to one aspect of the present application, an apparatus for installing a high and low voltage conversion circuit is provided, which includes: a first housing made of an insulation material and a second housing made of a metallic material; where the first housing is provided with a first opening and a second opening at both ends respectively in a first direction, and the second housing is provided with a third opening and a fourth opening at both ends respectively in the first direction; the first housing and the second housing are fixed, the first housing and the second housing are in contact on at least part of surfaces thereof; a first cavity is formed in the first housing for installing a high-voltage circuit, a second cavity is formed in the second housing for installing a low-voltage circuit, and the first cavity is parallel with the second cavity; the second opening is used for inserting therethrough a high voltage terminal electrically connected with the high-voltage circuit; and the fourth opening is used for inserting therethrough a low voltage terminal electrically connected with the low-voltage circuit.

According to another aspect of the present application, a high and low voltage conversion system is provided, which includes: a high-voltage circuit, a low-voltage circuit and the aforementioned apparatus.

According to another aspect of the present application, a power source is provided, which includes: a high voltage input terminal, a low voltage output terminal and a plurality of the aforementioned high and low voltage conversion systems; where high-voltage circuits of the plurality of the high and low voltage conversion systems are in series and electrically coupled with the high voltage input terminal; and low-voltage circuits of the plurality of the high and low voltage conversion systems are in parallel and electrically coupled with the low voltage output terminal.

DESCRIPTION OF EMBODIMENTS

Specific implementations of the present application will be detailed in conjunction with accompanying drawings, and it shall be appreciated that, the specific implementations described herein are merely intended to demonstrate and interpret the present application which is not limited to the following specific implementations.

In the description of the present application, it is understandable that, orientations or positional relations indicated by terms such as "upper", "lower", "left", "right", "inner", "outer" are based on the accompanying drawings, for the mere purpose of facilitating description of the present application or simplifying the description, rather than indicating or implying that the apparatus or elements involved must be specifically oriented or constructed or operated in specific orientations, and thus cannot be construed as limitations on the present application.

In addition, the terms of "first" and "second" are only intended for the purpose of description, and cannot be construed as indicating or implying relative importance, or implying the number of the involved technical features. As a result, features defined with "first" or "second" may explicitly or implicitly include at least one of such features.

Embodiment 1

This embodiment provides an apparatus for installing a high and low voltage conversion circuit, the apparatus can be applied in a high and low voltage conversion system of a medium-voltage branch power transmission line of a power equipment, and can also be applied in high and low voltage conversion systems under circumstances with other voltages, so as to improve safety of the high and low voltage conversion circuit.

Figure 1:
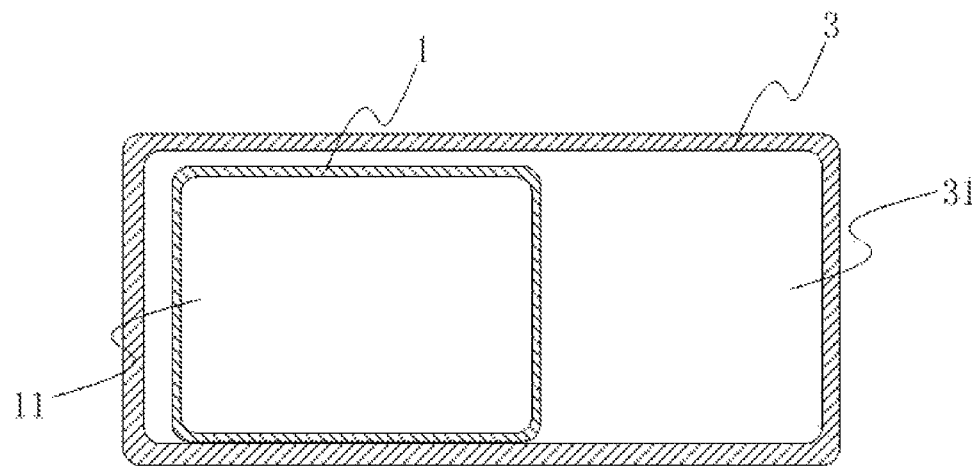
FIG. 1 is a sectional view of an apparatus for installing a high and low voltage conversion circuit provided by an embodiment of the present application.

FIG. 1 is a sectional view of an apparatus for installing a high and low voltage conversion circuit provided by an embodiment of the present application.

As shown in FIG. 1, the apparatus includes a first housing 1 made of insulation material and a second housing 3 made of metallic material. The first housing 1 is provided with a first opening (not shown in the figure) and a second opening (not shown in the figure) at both ends respectively in a first direction, and the second housing 3 is provided with a third opening (not shown in the figure) and a fourth opening (not shown in the figure) at both ends respectively in the first direction. The above first housing 1 and second housing 3 are fixed together, the first housing 1 and the second housing 3 are in contact on at least part of surfaces thereof. A first cavity 11 is formed in the first housing 1 for installing a high-voltage circuit, a second cavity 31 is formed in the second housing 3 for installing a low-voltage circuit, and the first cavity 11 is parallel with the second cavity 31. The second opening is used for inserting therethrough a high voltage terminal electrically coupled with the high-voltage circuit; and the fourth opening is used for inserting therethrough a low voltage terminal electrically coupled with the low-voltage circuit.

Specifically, the shapes of the first housing 1 and the second housing 3 can be arranged as actually required, without specific limitations herein. For example, the first housing 1 and the second housing 3 may be circular, elliptical or polygonal. For example, both the first housing 1 and the second housing 3 are arranged to be rectangular, which will help to overlap a plurality of apparatuses to optimize the size of the power electronic converter. The first opening and the third opening are arranged in the lateral direction, as well as the second opening and the fourth opening are arranged in the lateral direction. Additionally, the high voltage terminal electrically coupled with the high-voltage circuit and the low voltage terminal electrically coupled with the low-voltage circuit can use other type of conventional high voltage terminals and low voltage terminals, respectively.

According to one aspect of the present application, the insulation material of first housing 1 may be any material for electrical insulation in a conventional power equipment. For example, the aforementioned insulation material is a solid insulation material, and the dielectric strength thereof is greater than 2.6 kV/mm, so as to meet the insulation requirement of a medium-voltage circuit. As another example, the solid insulation material is epoxy resin, organic silicone resin, silica gel or polyurethane. In addition, the solid insulation material may be formed via any conventional method, such as by vacuum casting (Vacuum Casting), automatic pressure gelating (APG), vacuum pressure gelating (VPG) and other techniques.

In addition, the apparatus of this embodiment only requires at least part of the surfaces of the first housing 1 and the second housing 3 being in contact, and in actual arrangement, the first housing 1 and the second housing 3 can be arranged according to specific situations to realize surface contact. For example, in the case, right side surface of the first housing 1 may be in contact with left side surface of the second housing 3, or top surface (or bottom surface) of the first housing 1 may be in contact with bottom surface (or top surface) of the second housing 3, or bottom surface of the first housing 1 may be in contact with the bottom surface of the second housing 3, or top surface, left side surface and bottom surface of the first housing 1 are respectively in contact with the top surface, left side surface and bottom surface of the second housing 3.

In this embodiment, the arrangement of the first housing 1 made of the insulation material and the second housing 3 made of the metallic material allows the high-voltage circuit to be installed in the first housing 1 and the high voltage terminal connected with the high-voltage circuit to be introduced out of the second opening of the first housing 1, while allowing the low-voltage circuit to be installed in the second housing 3 and the low voltage terminal connected with the low-voltage circuit to be introduced out of the fourth opening of the second housing 3; and two air passages are formed through the openings of the first housing 1 and the second housing 3, so as to cool down by air cooling, without the need of additional separate water-cooling device, and reducing the volume and weight of the high and low voltage conversion system. Additionally, the high voltage terminal will not pass through the insulation material layer so as to ensure the integrity of the insulation material, thereby improving shielding effect of the first housing 1 against the high-voltage circuit. Meanwhile, the first cavity formed in the first housing 1 is parallel to the second cavity formed in the second housing 3, so that the high-voltage circuit and the low-voltage circuit may be arranged in parallel, which in turn reduces the length of the apparatus, allowing a compact structure. Moreover, in the apparatus of this embodiment, only the first housing 1 uses the insulation material, thus reducing consumption of the insulation material, further lowering cost and weight of the apparatus.

Further, still referring to FIG. 1, the first housing 1 is arranged in the second housing 3, and the above second cavity 31 is formed between the second housing 3 and the first housing 1. For example, both the first housing 1 and the second housing 3 are arranged to be rectangular, and the first housing 1 is inserted into the second housing 3 to be near the left side of the second housing 3, forming the above second cavity 31 between an outer wall on the right side of the first housing 1 and an inner wall on the right side of the second housing 3. Via the aforementioned arrangement, the structure of the whole device is relatively simple, and it is convenient to form a certain insulation capability between each other and improve the structural strength of the both.

Further, still referring to FIG. 1, three outer surfaces of the first housing 1 are in contact with an inner surface of the second housing 3. Specifically, a top surface, a left side surface and a bottom surface of the first housing 1 are respectively in contact with the inner surface of the second housing 3. The aforementioned arrangement makes it possible to increase the contact area between the first housing 1 and the second housing 3 and to utilize the space of the second housing 3 to the utmost, resulting in a compact-structured and small-sized apparatus.

Figure 2:
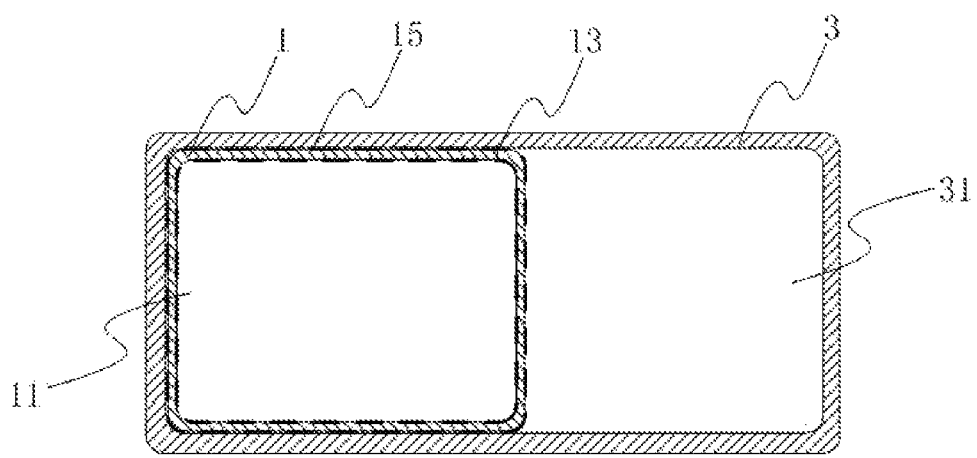
FIG. 2 is a sectional view of an apparatus for installing a high and low voltage conversion circuit provided by another embodiment of the present application.

Further, as shown in FIG. 2, an inner surface of the first housing 1 is provided with a first metal shielding layer 13, so as to apply a voltage stress to the insulation material of the first housing 1 for preventing air in the first housing 1 from being subject to breakdown due to discharge of the high-voltage circuit, thereby improving the insulation effect of the first housing 1. For example, the first metal shielding layer 13 may be a sheet metal part. Specifically, the first metal shielding layer 13 in this embodiment is required to cover the whole inner surface of the first housing 1, and additionally, the first metal shielding layer 13 may be made of other conventional metallic material with electrical conductivity. In addition, the first metal shielding layer 13 may be formed on the inner surface of the first housing 1 via any conventional method, such as by coating, spraying, electroplating and other techniques.

Figure 3:
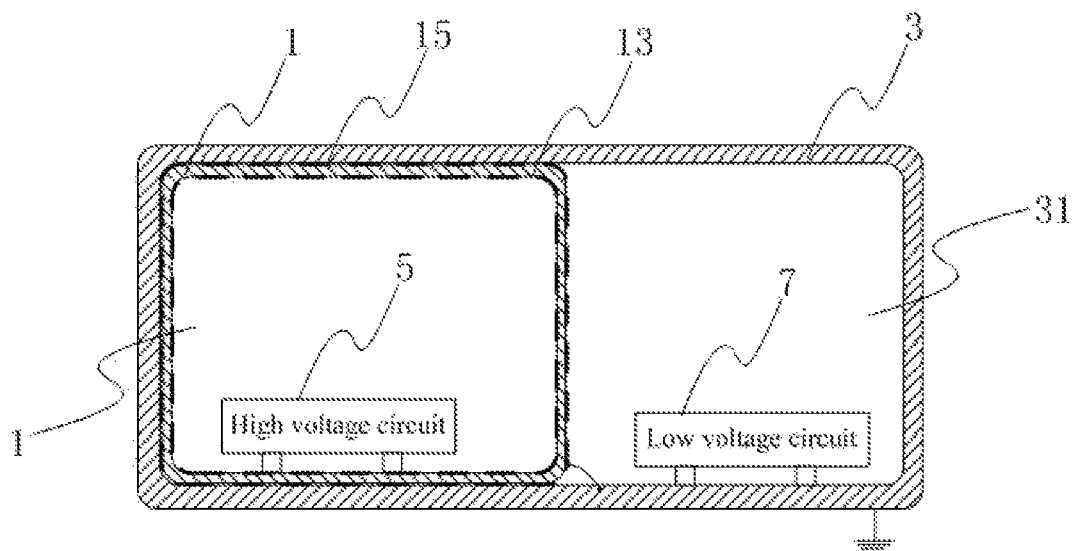
FIG. 3 is a sectional view of an apparatus for installing a high and low voltage conversion circuit provided by yet another embodiment of the present application.

Referring to FIG. 3, the first metal shielding layer 13 is electrically connected with the floating potential of the high-voltage circuit 5. In this embodiment, "floating" refers to a situation where there is no conductor for connecting the circuit to the ground. By electrically connecting the first metal shielding layer 13 with the floating potential of the high-voltage circuit 5, the high-voltage circuit 5 and the first metal shielding layer 13 can be viewed as equipotential, and as a result, the air in the first housing 1 may be prevented from being breakdown and discharging due to a high voltage.

Further, still referring to FIG. 2, the outer surface of the first housing 1 is also provided with a second metal shielding layer 15 for applying a voltage stress to the insulation material of the first housing 1, so as to avoid breakdown of the air in the second housing 3 caused by the high-voltage circuit 5 penetrating the insulation material, thus improving the insulation effect of the apparatus. For example, the second metal shielding layer 15 may be a sheet metal part. Specifically, the second metal shielding layer 15 in this embodiment is required to cover the whole outer surface of the first housing 1, and additionally, the second metal shielding layer 15 may be made of any conventional metallic material with electrical conductivity. In addition, the second metal shielding layer 15 may be formed on the outer surface of the first housing 1 via any conventional method, such as by coating, spraying, electroplating and other techniques. For example, referring to FIG. 3, the second metal shielding layer 15 is electrically connected with the ground terminal of the second housing 3, so as to alleviate the phenomenon of discharge by the air in the second housing 3 due to breakdown.

In some embodiments, no limitations are imposed for the above first metal shielding layer 13 and the second metal shielding layer 15 to be arranged at the same time, and those skilled in the art are free to, as actually required, make a selection from the following arrangements: arranging both the metal shielding layers simultaneously, separately arranging either of the metal shielding layers or arranging no metal shielding layer. For example, the inner surface and outer surface of the first housing 1 are respectively provided with the first metal shielding layer 13 and the second metal shielding layer 15, so as to improve the insulation performance of the overall apparatus, thus avoiding the air in the first housing 1 from undergoing breakdown and the air in the second housing 3 from undergoing breakdown.

Figure 4:
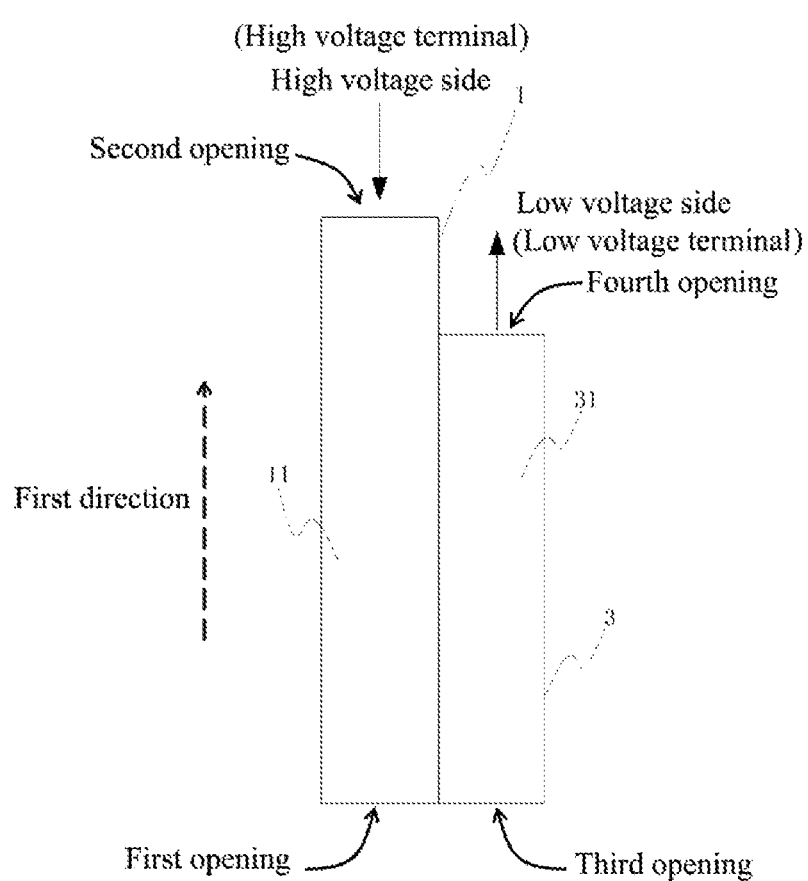
FIG. 4 is a top view of an apparatus for installing a high and low voltage conversion circuit provided by an embodiment of the present application.
Figure 5:
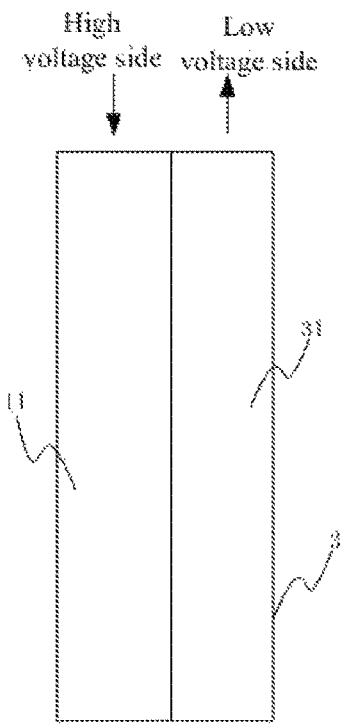
FIG. 5 is a top view of an apparatus for installing a high and low voltage conversion circuit provided by another embodiment of the present application.
Figure 6:
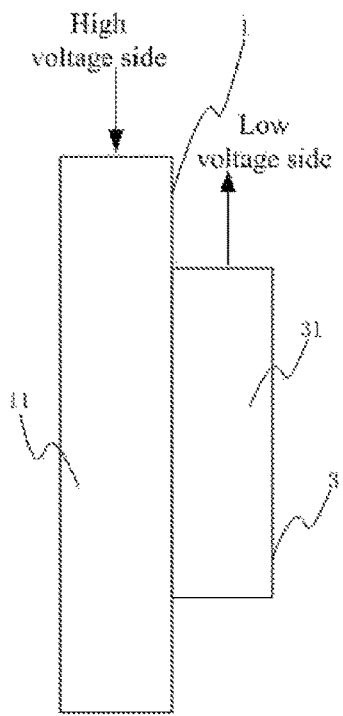
FIG. 6 is a top view of an apparatus for installing a high and low voltage conversion circuit provided by yet another embodiment of the present application.

FIG. 4 is a top view of an apparatus for installing a high and low voltage conversion circuit provided by an embodiment of the present application; FIG. 5 is a top view of an apparatus for installing a high and low voltage conversion circuit provided by another embodiment of the present application; and FIG. 6 is a top view of an apparatus for installing a high and low voltage conversion circuit provided by yet another embodiment of the present application.

Further, in an optional manner, the first opening of the first housing 1 is arranged flush with the third opening of the second housing 3 in the first direction. Specifically, in FIG. 4 and FIG. 5, along a lateral direction (the up and down direction in the figures, i.e. the first direction) of the first housing and the second housing, the lower openings of the first housing 1 and the second housing 3 are flush with each other.

In a second optional manner, the first opening of the first housing 1 and the third opening of the second housing 3 are disposed at an interval in the first direction. Specifically, in FIG. 6, along the up and down direction in the figure (i.e., the first direction), the lower opening of the first housing 1 is apart from the lower opening of the second housing 3 for a certain distance. Therefore, such an arrangement allows other circuit modules, such as a controller, to be placed at the lower openings, improving space utilization of the apparatus.

In a third optional manner, the second opening of the first housing 1 is arranged flush with the fourth opening of the second housing 3 in the first direction. Specifically, in FIG. 5, along the up and down direction in the figure (i.e., the first direction), the upper opening of the first housing 1 is flush with that of the second housing 3. As a result, in applications with a lower voltage level, such an arrangement may not only realize the safety clearance distance and creepage distance along surface between the high voltage side terminal and the low voltage side terminal, but also improve the space utilization in the housing.

In a fourth optional manner, the second opening of the first housing 1 and the fourth opening of the second housing 3 are disposed at an interval in the first direction. Specifically, in FIG. 4 and FIG. 6, along the up and down direction in the figure (i.e., the first direction), the upper opening of the first housing 1 is apart from the upper opening of the second housing 3 for a certain distance. Similarly, such an arrangement is advantageous to realize the safety clearance distance and creepage distance along surface between the high voltage side terminal and the low voltage side terminal within a compact structure.

When arranging the openings of the first housing 1 and the second housing 3 in practice, those skilled in the art may separately apply the aforementioned four arrangement manners of the openings as actually required, and may also select either one from the first two optional manners to be combined with either one of the last two optional manners, so as to obtain an appropriate safety clearance distance and creepage distance. For example, the first and the third optional manners are combined, or the second and the third optional manners are combined.

Embodiment 2

This embodiment provides a high and low voltage conversion system, which can be applied in a medium-voltage branch power transmission line of a power equipment, and can also be applied in circumstances with other voltages for realizing safe conversion between high and low voltages.

Figure 7:
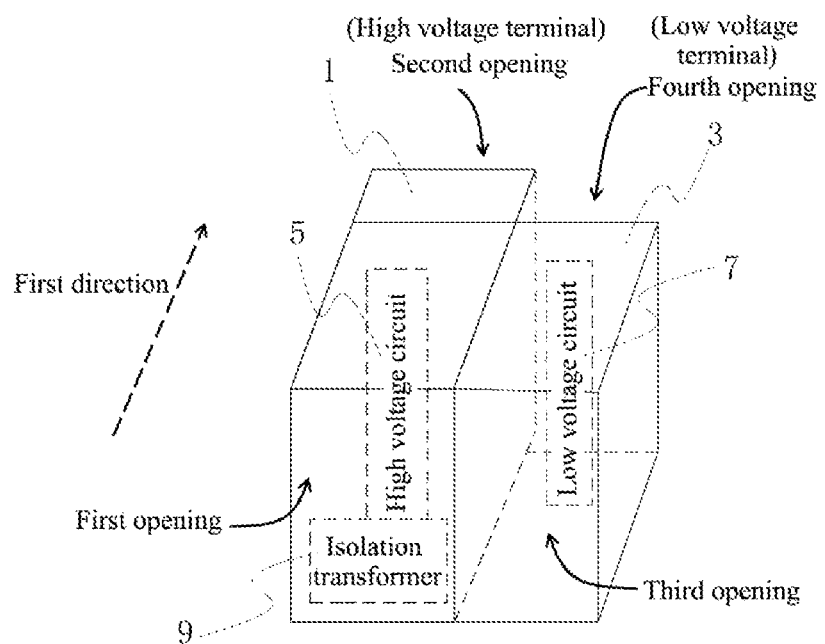
FIG. 7 is a structural diagram of a high and low voltage conversion system provided by an embodiment of the present application.
Figure 8:
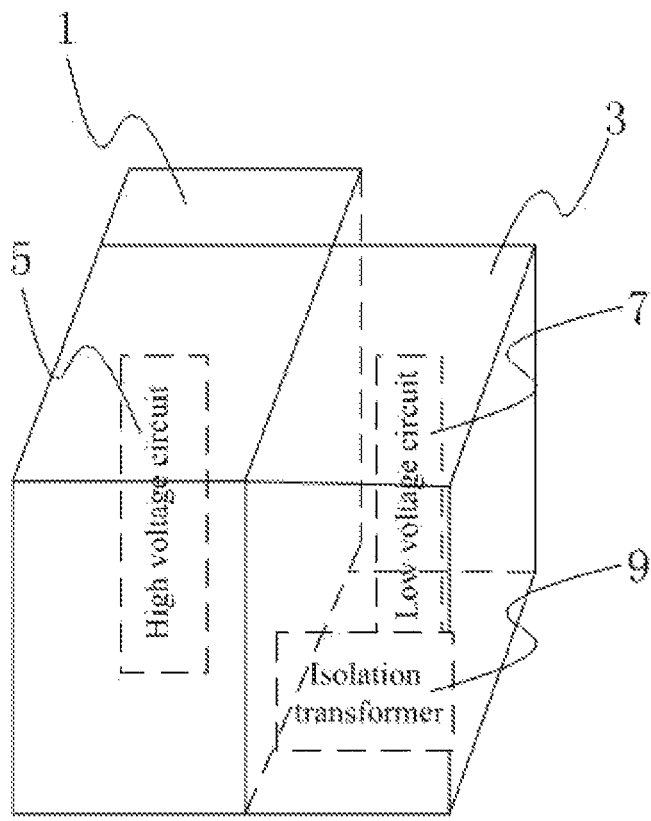
FIG. 8 is a structural diagram of a high and low voltage conversion system provided by another embodiment of the present application.

FIG. 7 is a structural diagram of a high and low voltage conversion system provided by an embodiment of the present application; FIG. 8 is a structural diagram of a high and low voltage conversion system provided by another embodiment of the present application; and FIG. 9 is a structural diagram of a high and low voltage conversion system provided by yet another embodiment of the present application.

Figure 9:
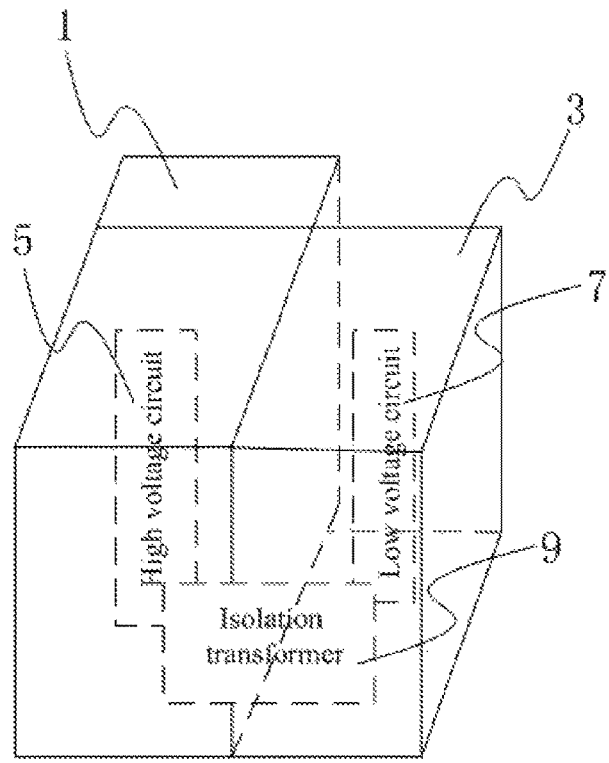
FIG. 9 is a structural diagram of a high and low voltage conversion system provided by yet another embodiment of the present application.

As shown in FIG. 7 to FIG. 9, the high and low voltage conversion system provided by this embodiment includes: a high-voltage circuit 5, a low-voltage circuit 7 and the apparatus for installing the high and low voltage conversion circuit according to the aforementioned embodiments.

Specifically, in this embodiment, the structure, principle and effect of the apparatus for installing the high and low voltage conversion circuit are the same with those in the aforementioned embodiments, which specifically can be referred to the aforementioned embodiments and will not be repeated herein.

According to the high and low voltage conversion system in this embodiment, the high-voltage circuit 5 is installed in the first housing 1 made of the insulation material, the high voltage terminal connected with the high-voltage circuit 5 is introduced out of the second opening of the first housing 1, and electrically coupled with the high voltage input terminal, meanwhile the low-voltage circuit 7 is installed in the second housing 3 made of the metallic material, and the low voltage terminal connected with the low-voltage circuit 7 is introduced out of the fourth opening of the second housing 3, and electrically coupled with the low voltage output terminal, such that two air passages are formed via the openings of the first housing 1 and the second housing 3, so that cooling may be carried out by means of air cooling, without the need of arranging a separate water-cooling device, and reducing the volume and weight of the high and low voltage conversion system. Additionally, the high voltage terminal will not pass through the insulation material layer so as to ensure the integrity of the insulation material, thus improving the shielding effect of the first housing 1 against the high-voltage circuit 5. In addition, the first cavity formed in the first housing 1 and the second cavity formed in the second housing 3 is parallel, so that the high-voltage circuit 5 and the low-voltage circuit 7 may be arranged in parallel, which in turn reduces the length of the apparatus, allowing a compact structure. Moreover, in the high and low voltage conversion system of this embodiment, only the first housing 1 uses the insulation material, thereby reducing the consumption of the insulation material, further lowering cost and weight of the apparatus.

Referring to FIG. 7, in a first optional manner, an isolation transformer 9 is provided in the first housing 1. Again, referring to FIG. 8, in a second optional manner, the isolation transformer 9 is provided in the second housing 3. Still referring to FIG. 9, in a third optional manner, the isolation transformer 9 is provided in the first housing 1 and the second housing 3.

Specifically, in this embodiment, the isolation transformer 9 may use any type of conventional isolation transformer applied between high and low voltage circuits. And the safety clearance distance and creepage distance between the isolation transformer 9 and the high-voltage circuit 5, and between the isolation transformer 9 and the low-voltage circuit 7 may be arranged according to an actual circuit.

Embodiment 3

Figure 10:
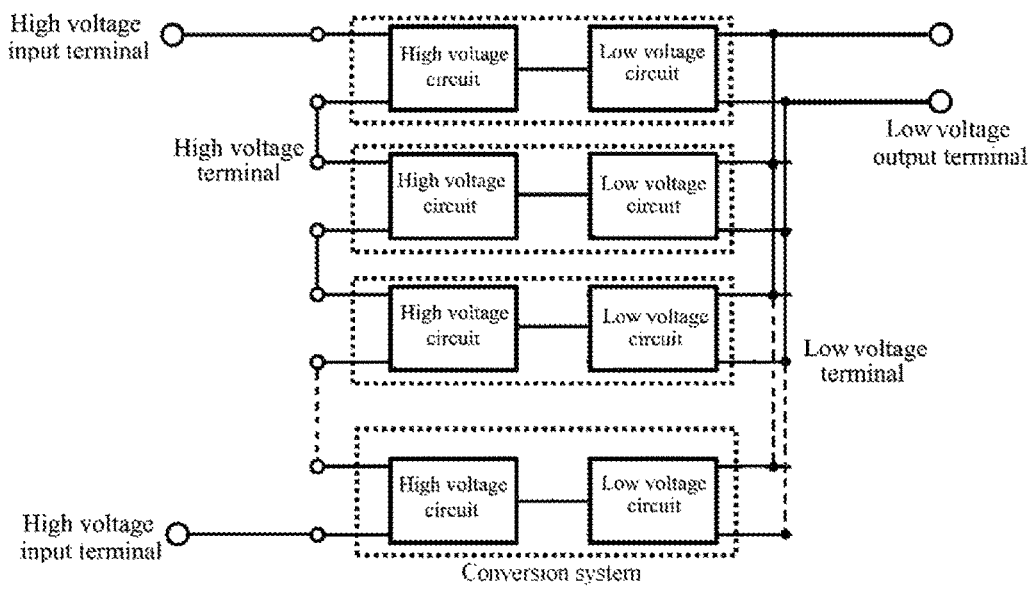
FIG. 10 is a structural diagram of a power source provided by an embodiment of the present application.

This embodiment provides a power source shown in FIG. 10, including: a high voltage input terminal, a low voltage output terminal and multiple high and low voltage conversion systems as mentioned above. The high-voltage circuits 5 of the multiple high and low voltage conversion systems are in series, and electrically coupled with the high voltage input terminal; and the low-voltage circuits 7 of the multiple high and low voltage conversion systems are in parallel, and electrically coupled with the low voltage output terminal.

Specifically, in this embodiment, the structure, principle and effect of the high and low voltage conversion system are the same with those in the aforementioned embodiments, which may refer to specific description in the aforementioned embodiments and will not be repeated herein. In addition, the high voltage input terminal may be any conventional input terminal provided high voltage input, including a power plant and transmission lines. The low voltage output terminal may be any conventional output terminal for transmitting power from a high voltage terminal to a user. Additionally, in this embodiment, the "high voltage" of the high voltage input terminal and the "low voltage" of the low voltage output terminal are described in relative terms, without defining the lower limit value of the high voltage, or the upper limit value of the low voltage.

In the power source of this embodiment, the high-voltage circuit 5 is installed in the first housing 1 made of the insulation material, and the high voltage terminal connected with the high-voltage circuit 5 is introduced out of the second opening of the first housing 1, and electrically coupled with the high voltage input terminal, while the low-voltage circuit 7 is installed in the second housing 3 made of the metallic material, and the low voltage terminal connected with the low-voltage circuit 7 is introduced out of the fourth opening of the second housing 3, and electrically coupled with the low voltage output terminal. In this way, two air passages are formed through the openings of the first housing 1 and the second housing 3, thereby enabling cooling by means of air cooling, without the need of arranging an additional water-cooling device, and reducing the volume and weight of the high and low voltage conversion system. Moreover, the high voltage terminal will not pass through the insulation material layer so as to ensure the integrity of the insulation material, improving the shielding effect of the first housing 1 against the high-voltage circuit 5. In addition, the first cavity formed in the first housing 1 and the second cavity formed in the second housing 3 is parallel, so that the high-voltage circuit 5 and the low-voltage circuit 7 may be arranged in parallel, which in turn reduces the length of the apparatus, allowing a compact structure. Moreover, in the high and low voltage conversion system of the power source of this embodiment, only the first housing 1 uses the insulation material, thus reducing consumption of the insulation material, and lowering cost and weight of the apparatus.

Finally, the above embodiments are merely meant to illustrate rather than limit the technical solutions of the present application; and although the present application has been concretely described in reference to the above embodiments, one with ordinary skill in the art shall understand that modifications can still be made to the technical solutions recorded in the foregoing embodiments, or that equivalent substitutions can still be made to part or all of the technical features therein; neither these modifications nor these substitutions shall make the essence of the corresponding technical solutions depart from the scope of the technical solutions in the above embodiments of the present application.

What is claimed is:

1. An apparatus for installing a high and low voltage conversion circuit, comprising: a first housing made of an insulation material and a second housing made of a metallic material; wherein
   the first housing is provided with a first opening and a second opening at both ends respectively in a first direction, and the second housing is provided with a third opening and a fourth opening at both ends respectively in the first direction;
   the first housing and the second housing are fixed, and the first housing and the second housing are in contact on at least part of surfaces thereof;
   a first cavity is formed in the first housing for installing a high-voltage circuit, a second cavity is formed in the second housing for installing a low-voltage circuit;
   the second opening is used for inserting therethrough a high voltage terminal electrically coupled with the high-voltage circuit; and
   the fourth opening is used for inserting therethrough a low voltage terminal electrically coupled with the low-voltage circuit.

2. The apparatus according to claim 1, wherein the first housing is arranged in the second housing, and the second cavity is formed between the second housing and the first housing.

3. The apparatus according to claim 2, wherein three outer surfaces of the first housing are in contact with an inner surface of the second housing.

4. The apparatus according to claim 2, wherein an inner surface of the first housing is provided with a first metal shielding layer.

5. The apparatus according to claim 4, wherein the first metal shielding layer is electrically connected with a floating potential of the high-voltage circuit.

6. The apparatus according to claim 2, wherein an outer surface of the first housing is provided with a second metal shielding layer.

7. The apparatus according to claim 6, wherein the second metal shielding layer is electrically coupled with a ground terminal of the second housing.

8. The apparatus according to claim 1, wherein the insulation material is a solid insulation material, and dielectric strength of the solid insulation material is greater than 2.6 kV/mm.

9. The apparatus according to claim 8, wherein the solid insulation material is epoxy resin, organic silicone resin, silica gel or polyurethane.

10. The apparatus according to claim 1, wherein the first opening is arranged flush with the third opening in the first direction.

11. The apparatus according to claim 1, wherein the first opening and the third opening are disposed at an interval in the first direction.

12. The apparatus according to claim 1, wherein the second opening is arranged flush with the fourth opening in the first direction.

13. The apparatus according to claim 1, wherein the second opening and the fourth opening are disposed at an interval in the first direction.

14. A high and low voltage conversion system, comprising: a high-voltage circuit, a low-voltage circuit and the apparatus for installing the high and low voltage conversion circuit according to claim 1.

15. The high and low voltage conversion system according to claim 14, wherein an isolation transformer is provided in the first housing of the apparatus.

16. The high and low voltage conversion system according to claim 14, wherein an isolation transformer is provided in the second housing of the apparatus.

17. The high and low voltage conversion system according to claim 14, wherein an isolation transformer is provided in the first housing of the apparatus and the second housing of the apparatus.

18. A power source, comprising: a high voltage input terminal, a low voltage output terminal and a plurality of the high and low voltage conversion systems according to claim 14; wherein
   high-voltage circuits of the plurality of the high and low voltage conversion systems are in series and electrically coupled with the high voltage input terminal of the power source; and
   low-voltage circuits of the plurality of the high and low voltage conversion systems are in parallel and electrically coupled with the low voltage output terminal of the power source.

19. The apparatus according to claim 1, wherein the first opening and the second opening form a first air passage, and the third opening and the fourth opening form a second air passage.

20. The apparatus according to claim 1, wherein both the first housing and the second housing are arranged to be rectangular, an axis of the first cavity is parallel with an axis of the second cavity.

* * * * *